US012155493B2

(12) United States Patent
vom Stein

(10) Patent No.: US 12,155,493 B2
(45) Date of Patent: Nov. 26, 2024

(54) INTERCONNECTION ELEMENT, PSE COMPONENT AND METHOD FOR MONITORING AND PROTECTING A PODL NETWORK

(71) Applicant: TURCK Holding GmbH, Halver (DE)

(72) Inventor: Johannes vom Stein, Hückeswagen (DE)

(73) Assignee: TURCK Holding GmbH, Halver (DE)

( * ) Notice: Subject to any disclaimer, the term of this patent is extended or adjusted under 35 U.S.C. 154(b) by 19 days.

(21) Appl. No.: 17/816,532

(22) Filed: Aug. 1, 2022

(65) Prior Publication Data

US 2023/0042972 A1 Feb. 9, 2023

(30) Foreign Application Priority Data

Aug. 2, 2021 (DE) .......................... 102021119955.7

(51) Int. Cl.
*G06F 1/00* (2006.01)
*G01R 19/165* (2006.01)
*G06F 11/30* (2006.01)
*H04L 12/10* (2006.01)
*H04L 43/50* (2022.01)

(52) U.S. Cl.
CPC ........ *H04L 12/10* (2013.01); *G01R 19/16519* (2013.01); *H04L 43/50* (2013.01)

(58) Field of Classification Search
CPC ............................... H04L 12/10; H04L 43/50
See application file for complete search history.

(56) References Cited

U.S. PATENT DOCUMENTS

| | | | | |
|---|---|---|---|---|
| 5,694,109 | A | * | 12/1997 | Nguyen .............. H04L 12/2803 236/51 |
| 7,702,302 | B1 | | 4/2010 | Stineman, Jr. |
| 10,673,717 | B1 | * | 6/2020 | Perevalov ........... H04L 41/0866 |

(Continued)

FOREIGN PATENT DOCUMENTS

| | | |
|---|---|---|
| DE | 102015105702 B3 | 8/2016 |
| DE | 102020113822 A1 | 12/2020 |

OTHER PUBLICATIONS

Extended European Search Report in EP Appl. No. 22182937.7 mailed Dec. 19, 2022, 16 pages.

(Continued)

*Primary Examiner* — Mohammed H Rehman
(74) *Attorney, Agent, or Firm* — Kowert, Hood, Munyon, Rankin & Goetzel, P.C.; Gentry C. McLean; Dean M. Munyon

(57) ABSTRACT

Techniques are disclosed relating to limiting power in Power over Data Line (PoDL) networks. In an embodiment, an apparatus includes a voltage terminal including a first pole and a second pole, a first line for connecting the first pole to a first terminal of a physical layer of a microelectronic component, and a second line for connecting the second pole to a second terminal of the physical layer. The apparatus may further include a switching element in each of the first and second line, where each switching element is connected to and controllable by a control unit and the control unit includes a microprocessor. The apparatus may further include a voltage measurement unit configured to measure a voltage drop over each switching element and supply the voltage drop to the microprocessor.

19 Claims, 3 Drawing Sheets

(56) References Cited

U.S. PATENT DOCUMENTS

| | | |
|---|---|---|
| 11,754,627 B2 | 9/2023 | Vom Stein |
| 2008/0198635 A1* | 8/2008 | Hussain .................. H02M 1/32 |
| | | 363/21.11 |
| 2016/0142217 A1* | 5/2016 | Gardner ................ B60L 3/0069 |
| | | 307/1 |
| 2017/0012788 A1* | 1/2017 | Rimboim ................ H04L 12/10 |
| 2019/0312751 A1* | 10/2019 | Goergen ................ G01R 31/58 |
| 2019/0386836 A1 | 12/2019 | Gong et al. |
| 2020/0159307 A1* | 5/2020 | Roy .......................... G06F 1/28 |
| 2020/0161742 A1* | 5/2020 | Leitermann ............ G16H 40/20 |
| 2021/0109294 A1* | 4/2021 | Marques .............. G02B 6/3849 |
| 2022/0021548 A1* | 1/2022 | Goergen ................ G06F 1/266 |
| 2023/0035480 A1* | 2/2023 | Chu .................... G06F 13/4282 |

OTHER PUBLICATIONS

Search Report in Appl. No. DE 10 2021 119 955.7 mailed Mar. 17, 2022, 13 pages.

* cited by examiner

INTERCONNECTION ELEMENT, PSE COMPONENT AND METHOD FOR MONITORING AND PROTECTING A PODL NETWORK

PRIORITY CLAIM

The present application claims priority under 35 U.S.C. § 119 to German patent application 10 2021 119 955.7, filed Aug. 2, 2021, the disclosure of which is incorporated by reference herein in its entirety.

BACKGROUND

Technical Field

This disclosure relates generally to electronic circuits, and more particularly to techniques for limiting power applied to power over data line (PoDL) networks.

Description of the Related Art

Prior techniques have been used for limiting power in control system networks such as fieldbus. Some of these approaches are applicable only to bus technologies in which data lines are separate from power lines. Other approaches that have been used for PoDL networks such as Single Pair Ethernet (SPE) have various technical shortcomings. In some cases, for example, power levels cannot be checked while data is transmitted. Other approaches may result in power losses caused by the protection circuit.

DETAILED DESCRIPTION

Figure 1:
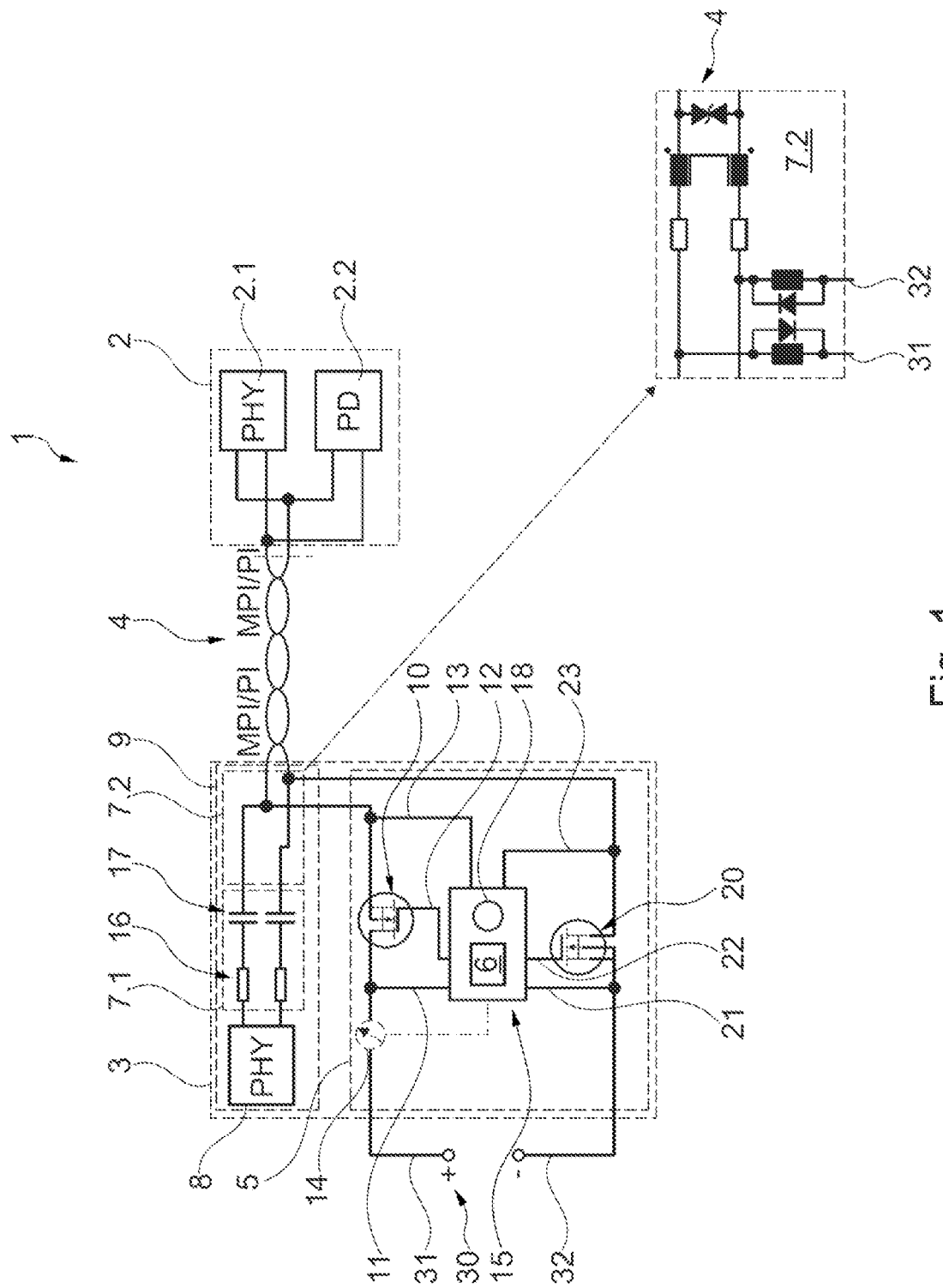
FIG. 1 is a block diagram depicting an embodiment of a network link.

Prior safety devices for fieldbus applications have been used for safely limiting the power in order to protect people. For example, DE 10 2020 113 822 A1 discloses an output safety device in which the output switching elements need not be cyclically disconnected for testing since they are located in a permanently active control loop which monitors their proper functioning, wherein the gate voltages are measured, among other things. This interconnection is designed only for bus technologies in which the data line is separate from the power lines. In Power over Data Line (PoDL) technology, the power supply and data are transmitted over the same wires. Therefore, there are no additional wires present for implementing a functionally safe disconnection in which the de-energised state is the safe state. The aforementioned solution as per DE 10 2020 113 822 A1 is thus not suitable for transmission technologies such as Power over Data Line (PoDL), Single Pair Ethernet (SPE) etc. in which the data are transmitted over power lines.

As another example, U.S. Pat. No. 7,702,302 B1 discloses an SPE interconnection that in each case has a field-effect transistor (FET) and a measuring resistor for current measurement in the high side and low side of the power supply in order to thus allow the current to be measured redundantly. The drawback of this interconnection is that a cyclical test of the FETs in the closed state cannot be carried out, and a high level of safety is therefore not achieved. In addition, the measuring resistors are wired in the power path, which results in power losses. Moreover, US 2019/0312751 A1 discloses an SPE interconnection which likewise has an FET in the high side and low side of the power supply. In addition, a safety algorithm is proposed in which the FETs are disconnected in a successive manner. The drawback of this solution is that no communication can take place during the safety algorithm, and the FETs thus cannot be checked on a continuous basis.

An object of the disclosed embodiments is to propose an improved interconnection also for data-carrying power lines (PoDL), in which the power is safely limited. In various disclosed embodiments, this is achieved by an interconnection element, a power sourcing equipment (PSE) component and a method for monitoring and protecting a PoDL network or network segment. The respective associated claims set out advantageous designs.

Accordingly, the object is achieved by an electronic interconnection element of a PSE component for a PoDL network or network segment, in particular an SPE network or network segment, comprising a voltage terminal and/or voltage source, a first line for connecting a pole of the voltage terminal to a first terminal of a physical layer (PHY), a second line for connecting the second pole of the voltage terminal to the second terminal of the physical layer (PHY), at least one switching element in each of the lines, wherein the switching elements are connected to and controllable by at least one control unit comprising a microprocessor, and wherein at least one voltage measurement unit is provided, by means of which the voltage drop over each switching element can be recorded as a measured value and supplied to the microprocessor.

In short, using the interconnection, the current and voltage can be (at least) measured redundantly, computed and compared in order to calculate the power. In the process, the current is measured (at least additionally) by measuring the gate voltages of at least two field-effect transistors (FETs).

By means of this interconnection element, functionally safe power limiting as per IEC 61508 is achieved. Furthermore, intrinsic safety as per IEEE 802.3cg:2019 can also be achieved. In this context, in an improved embodiment of the interconnection element, when in the conducting state, the two switching elements have, as a manipulated variable, a voltage that is proportional to the current being transmitted, and are connected to the control unit for data transmission.

Advantageously in this case, at least one switching element is a field-effect transistor (FET), in particular a normally closed (nc) field-effect transistor. Alternatively, the switching elements can also be configured as a MOSFET or IGBT. In order to compare the voltages and currents, it is particularly advantageous if the switching elements are structurally and functionally the same, i.e. identical or substantially identical.

The disclosed embodiments also include a power sourcing equipment (PSE) component for a PoDL network and/or a PoDL network segment, in particular an SPE network and/or network segment, comprising the following components:

a microelectronic component having a physical layer (PHY), which can be connected to a powered device (PD) by means of a line, in particular an SPE connection (TPE), a safety circuit, which at its input comprises and/or can be connected to a voltage source, wherein the safety circuit is connected upstream of the microelectronic component, wherein the safety circuit is configured as an interconnection element according to one of the preceding claims. In this context, "connected upstream" means that the safety circuit is provided as a monitoring and protection apparatus between the current supply of a voltage source, the microelectronic component comprising a PHY and the powered device (PD).

The PSE component can be further improved in that the physical layer (PHY) has two terminals, wherein an interconnection of passive components, in particular of at least one resistor and at least one capacitor, is connected immediately upstream of each of the terminals.

The interconnection element includes a PHY, a PSE component and a coupling to passive components. The coupling towards the PHY has to be safety-oriented by design. The failure of a component must not lead to power being coupled in over that route. This can be implemented as proposed in IEEE 802.3cg:2019 to achieve intrinsic safety. Here, the critical components are doubled, wired either in series or in parallel depending on the function.

The disclosed embodiments also include a method for monitoring and protecting a PoDL network and/or network segment, wherein at least one switching element is provided in each of two lines connected to a voltage source, and the voltage drop over each switching element is measured, wherein the switching elements are actuated depending on the actual measured voltage values (controlled variable) by way of a voltage (manipulated variable) that is proportional to the current flow (disturbance variable).

In an improved variant of the method, the current flow in both lines is measured in a technically independent manner, and the measured values and/or data derived therefrom are evaluated together in a processor unit by calculating the current flow in each switching element on the basis of the actuation voltage and comparing the current flow of the two switching elements for monitoring purposes.

Advantageously, the current flow in each switching element is measured on the basis of the actuation voltage (U_GS, gate voltage) of the current flow (disturbance variable, I-S), i.e. is computed from the actuation voltages (U_GS, gate voltage). It is computed concurrently and independently in the two switching elements. By means of the current flows generated and compared in this way, the network or network segments are monitored and any required process control, warning messages and/or disconnections are initiated on that basis.

An improvement to the method involves tapping the actual measured voltage value at least at one of the line portions of the lines connected to the voltage source, either upstream or downstream of the switching elements, namely
between the voltage source and the switching elements (upstream) and/or
downstream of the switching elements as viewed from the voltage source.

In the first case ("upstream of" the switching elements), the actual voltage is tapped on the source side of the switching element in the positive-pole line and on the drain side of the switching element in the negative-pole line. In the second case ("downstream of" the switching elements), the actual voltage is tapped on the drain side of the switching element in the positive-pole line and on the source side of the switching element in the negative-pole line. The two actual voltages can be measured concurrently, sequentially and/or in a clocked manner for monitoring purposes.

The method thus provides for the switching elements, for example the FETs, to be located in a control loop. The current value is calculated concurrently on the basis of the actuation voltage (U_GS, gate voltage), and the currents through the two switching elements are compared and monitored on that basis. If an inequality of the currents is noted, both switching elements are disconnected because the inequality indicates a fault involving either the switching element itself or a coupled-in interference potential.

In an embodiment, a separately measured current is evaluated and compared with a specification, such as an FET characteristic. In the process, in a normal situation the current is not actively limited but rather is monitored and disconnected if it exceeds the limit. The PHY transmission power is not separately measured, monitored or limited but rather the actual power supply and/or the voltage source itself are fully disconnected. Advantageously, a transmission power of the PHY remains as an autonomous signal even after a disconnection, the transmission power thereof being less than 0.5 W.

To monitor the operating mode and proper functioning of the switching elements themselves, in a further improved variant of the method a target characteristic for each switching element is stored, and the resistance value and/or the gate voltage (U_GS) of the two switching elements is/are altered within defined boundaries, and the actual value is compared with a target characteristic curve, and/or a range based on an admissible tolerance from the target characteristic curve, of each switching element. The resistance value and/or the relevant gate voltage (U_GS) can be altered individually or synchronously.

In a further, improved variant of the method, after a disconnection due to a detection of an unequal amperage and/or an unequal current flow, a user intervention occurs before any re-closing, in particular after a fault analysis and/or fault correction carried out by a user, or the controller makes a specification by specifying an output limit or a power limit, such that re-closing and/or normal operation take(s) place on the basis of internal specifications of the controller.

Advantageously, a PSE component configured according to one of the aforementioned embodiments and operated accordingly is used in the method. The method described herein in the various embodiments can in particular be used for a power supply and data network in which the data and the current are transmitted together over a two-wire cable, in particular a Single Pair Ethernet (SPE) and/or a Twisted Pair Ethernet (TPE).

In the process, the limiting of the current can involve disconnecting the current either entirely to 0 A or to a defined value>0, in particular to a value of up to 100 mA. The advantage of not fully disconnecting the current is that, with a small current flow, data transmission can also continue, for example in order to transmit status data or relay control commands.

A particular advantage is that the same FETs as those used for disconnection can also be used as the output switching elements for current measurement, meaning that no additional components have to be installed in the power path. As a result, by means of this interconnection it is also possible to safely limit the power and disconnect an electronic component or device which itself does not include any safety function, such as for example a frequency converter. Using the interconnection according to the invention, complex, functionally safe bus communication can be dispensed with since the power limiting and, as necessary, disconnection take place in an improved manner.

Further details and advantages of the invention will now be explained in more detail with reference to embodiment examples represented in the drawings.

The PoDL network or network segment 1 shown in FIG. 1 is constructed as generally intended in IEEE 802.3cg: 2019. It comprises a physical layer 8 (PHY) for communicating the data on both sides of the SPE system 4, namely on the side of the PSE 3 (power sourcing equipment) and on the other side of the SPE system, the PD 2 (powered device).

The disclosed embodiments relate to the side of the PSE 3, so that the PD 2 is not explained in more detail and comprises the (micro)electronic components and component parts that are common for a person skilled in the art.

The PSE 3 substantially comprises a protective circuit 9, consisting of the PHY 8 and the passive components 7.1, 7.2, and an interconnection element 5. The protective circuit 9 comprises the passive components 7.1 and 7.2 for coupling the PHY and the PSE. Such passive components 7.1, 7.2 are necessary for the coupling. In this case, the passive component 7.1 has to be safety-oriented by design. As a result, in the event of a simple fault, the protective function is maintained, thereby making a safety-relevant fault highly unlikely. In the process, the transmission power of the PHY 8 is the lowest power level. Ideally, the detection of the PD 2 by way of a detection voltage and the communication of the power classes by way of the serial communication classification protocol (SCCP) comply with the usual standards. In the present case, a passive component 7.1 is provided in the protective circuit 9 and comprises a resistor 16 and a capacitor 17 connected in series. The construction of the second passive component 7.2 is shown in the bottom, detailed view in enlarged form showing the individual components.

Figure 2:
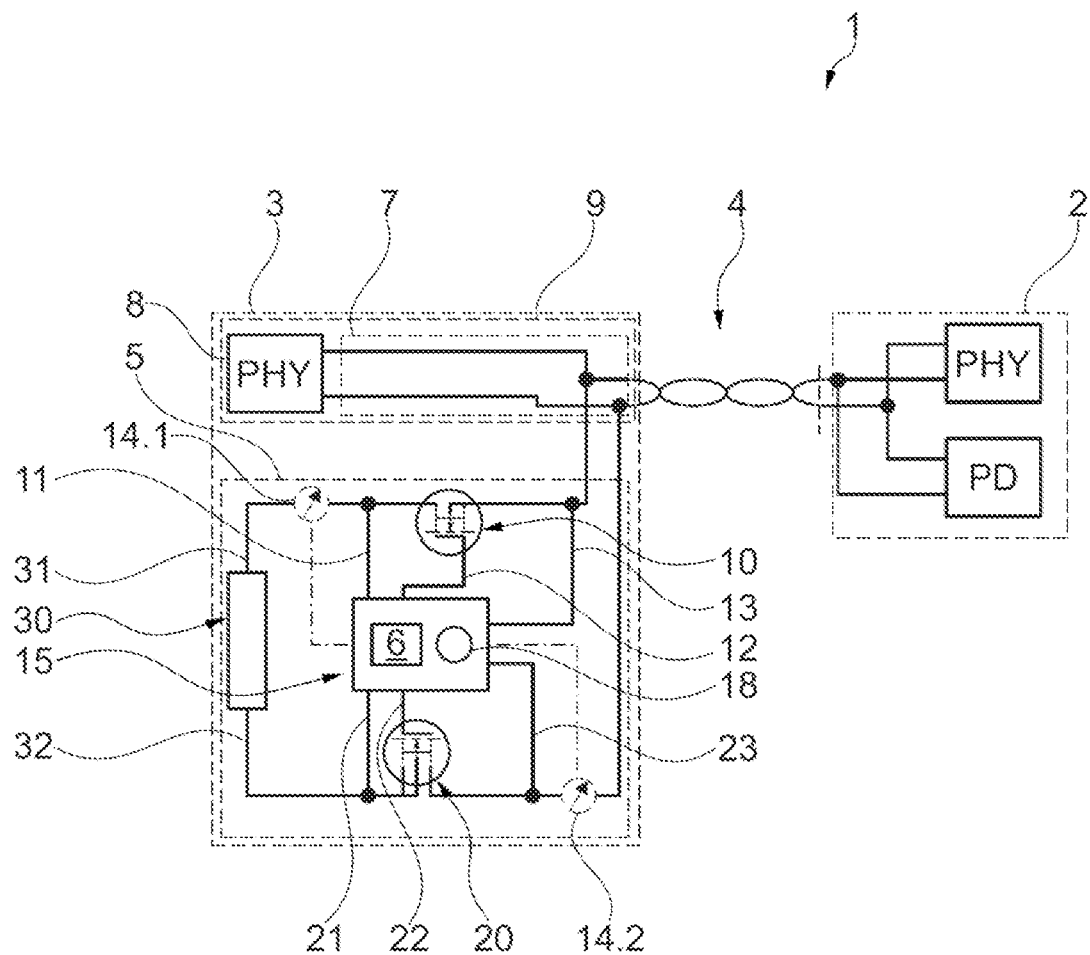
FIG. 2 is a block diagrams depicting another embodiment of a network link.

The interconnection element 5 comprises a voltage terminal 30 (positive pole) having a first line 31, which leads to the first terminal 8.1 of the physical layer (PHY) 8. The second line 32 connects the other voltage terminal 30 (negative pole) to the second terminal 8.2 of the PHY 8 of the PSE 3. Both lines 31, 32 each comprise a switching element 10, 20 configured as an FET. The voltage terminal 30 can lead to an external source, as indicated in FIG. 1, or into an integrated source, such as a battery, as shown in FIG. 2. A central control unit 15 taps the voltage (U_DS) over the respective switching element 10, 20 (FET) via the line pair 11, 13 in the first line 31 and via the line pair 21, 23 in the second line 32. Furthermore, each switching element 10, 20 is controlled, in an open- and closed-loop manner, by means of a respective associated control line 12, 22 connected to the control unit 15. The control unit 15, which for example has a circuit board as a basic support, also comprises a microprocessor 6 for at least one part of the data processing, and a voltmeter 18. Further miscellaneous common (micro) electronic elements of the control unit 15 are not shown. In the embodiment example shown, the control is carried out electronically by means of operational amplifiers, but can also be carried out by means of the microprocessor. In the present case, the microprocessor is used for control and monitoring purposes.

The functionally safe disconnection according to the invention only concerns the PSE 3. Therefore, in the event of disconnection, the power can be limited to the maximum transmission power of the PHY 8. Ethernet can optionally be used as a black channel for a safe protocol. It is thus possible to operate a safe protocol (e.g. PROFIsafe or CIPP Safety). Both a safe protocol and a standard protocol can be operated. However, the advantage of the invention is that the improved safe disconnection is possible even without a safe protocol.

The rated voltages and currents for the PSE 3 as per IEEE 802.3cg:2019 are set out in Table 1 below and can all be provided.

TABLE 1

| Class | 0 | 1 | 2 | 3 | 4 | 5 | 6 | 7 | 8 | 9 |
|---|---|---|---|---|---|---|---|---|---|---|
| Voltage [V] | 5.5-18 | 5.5-18 | 14-18 | 14-18 | 12-36 | 12-36 | 26-36 | 26-36 | 48-60 | 48-60 |
| Amperage [A] | 0.10 | 0.22 | 0.25 | 0.47 | 0.10 | 0.34 | 0.21 | 0.46 | 0.73 | 1.3 |
| PD power | 0.5 | 1 | 3 | 5 | 1 | 3 | 5 | 10 | 30 | 50 |

FIG. 1 also shows an additional ammeter 14 as an optional extension, which is likewise connected to the control unit 15 by way of a dash-dot data line. The current flow measured thereby in the positive-pole line 31 can be compared with the currents calculated from the voltages and used for monitoring. As shown in FIG. 2, this additional separate current measurement can be further improved if an additional ammeter 14.1, 14.2 is provided in the two lines 31, 32 and the currents thus calculated are compared and used for monitoring.

Figure 3A:
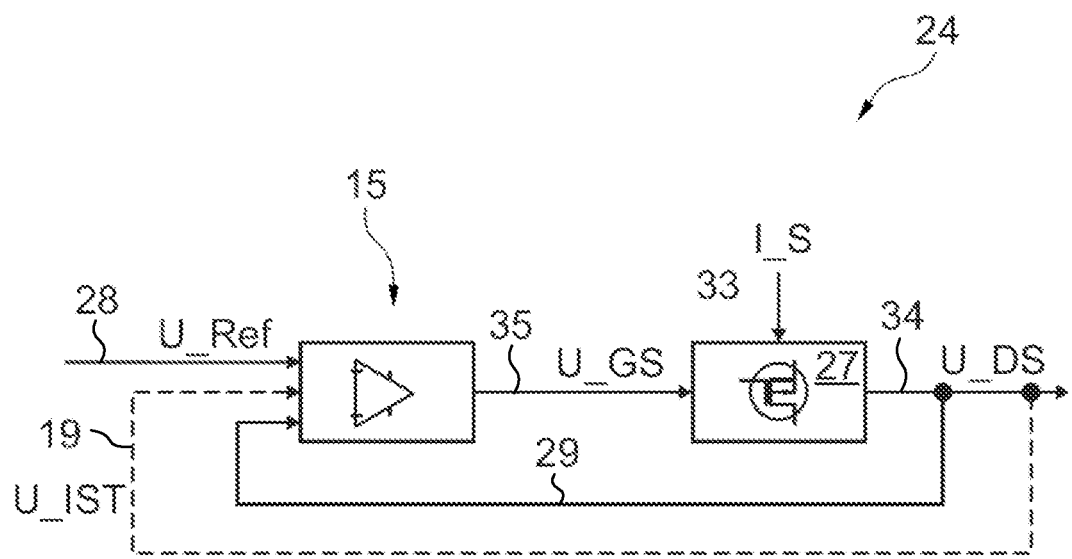
FIG. 3*a* is a signal flow diagram illustrating operation of an interconnection element, according to an embodiment.
Figure 3B:
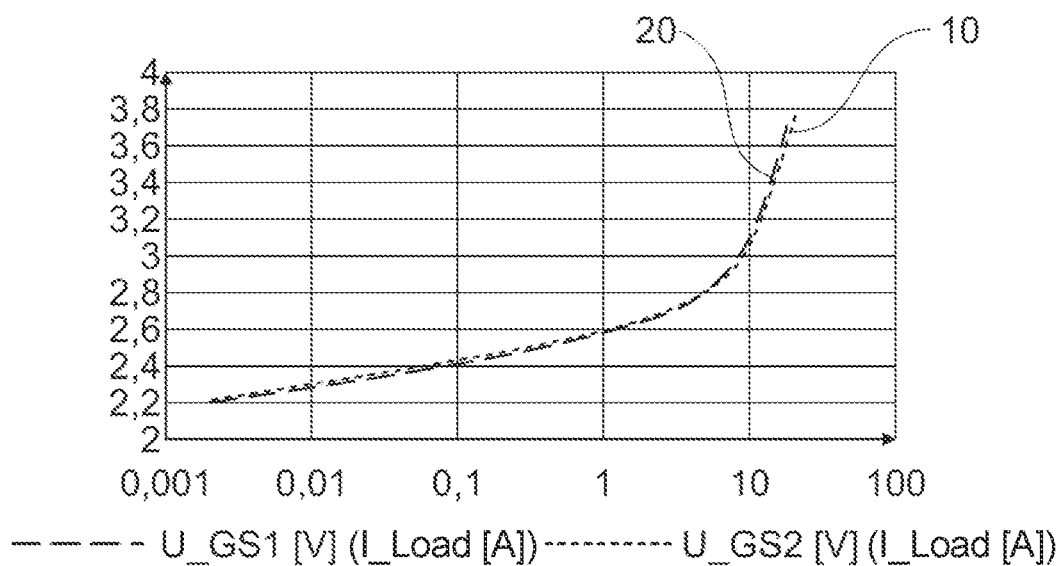
FIG. 3*b* is a graph illustrating a relationship between current through a switching element and a control voltage applied to the element, according to an embodiment.

As set out in FIG. 3a, the switching elements (FETs) are in the closed state in a control loop 24 in which the voltage 34 (U_DS) is kept constant as a controlled variable. This voltage 34 is tapped via the lines 11, 13 in the line 31 and via the lines 21, 23 in the line 32, as shown in FIGS. 1 and 2. In the process, the (gate) voltage 35 (U_GS) applied via the control lines 12, 22 is in a typical relationship with the disturbance variable 33 (I_S) of the flowing current. This relationship can be derived from a component-specific characteristic curve for each adjustment element 10, 12, as shown in the graph in FIG. 3b.

Optionally, as indicated by the dashed arrow, the output voltage 19 (U_IST) can furthermore also be (redundantly) measured via the lines 13 in the first line 31 (positive pole) and the second line 32 (negative pole), read back via the line 23, referred to as "downstream of" the switching elements 10, 20 above. Alternatively, measurements can analogously be taken via the line pair 11, 21, referred to as "upstream of" the switching elements 10, 20 above.

If only the power supply is disconnected, the PHY 8 is limited to the transmission power. For this, the power or current need not be measured precisely. The current measurement is used substantially to monitor the switching elements 10, 20 configured as FETs. In this variant, therefore, only two safe power stages are generally provided.

Alternatively, a safety-oriented measurement of the current and voltage can be carried out, on which basis the power is computed. The power is compared with a specification, such as for example the power classes as per IEEE 802.3cg: 2019 in line with the above table. For this purpose, the specification must always be configured in a safe manner. Any Skinny Client Control Protocol (SCCP) present has a control action. If the specification is not complied with, safe disconnection is triggered.

The following set ("Set A") of numbered clauses set out various non-limiting embodiments disclosed herein:

A1. An electronic interconnection element (5) of a PSE component (3) for a PoDL network or network segment (1), in particular an SPE network or network segment, comprising
a voltage terminal (30) and/or voltage source,
a first line (31) for connecting a pole of the voltage terminal (30) to a first terminal (8.1) of a physical layer (PHY) (8),
a second line (32) for connecting the second pole of the voltage terminal (30) to the second terminal (8.2) of the physical layer (PHY) (8),
at least one switching element (10, 20) in each of the lines (31, 32), characterized in that the switching elements (10, 20) are connected to and controllable by at least one control unit (15) comprising a microprocessor (6), and wherein at least one voltage measurement unit (18) is provided, by means of which the voltage drop over each switching element (10, 20) can be recorded as a measured value and supplied to the microprocessor (6).

A2. An interconnection element (5) according to clause A1, characterized in that, when in the conducting state, the two switching elements (10, 20) have, as a manipulated variable, a voltage that is proportional to the current being transmitted, and are connected to the control unit (15) for data transmission.

A3. An interconnection element (5) according to one of clauses A1 or A2, characterized in that at least one switching element (10, 20) is a field-effect transistor (FET), in particular a normally closed (nc) field-effect transistor.

A4. An interconnection element (5) according to clause A3, characterized in that the at least one switching element (10, 20) is a MOSFET or an IGBT A5. An interconnection element (5) according to one of the preceding clauses, characterized in that the switching elements (10, 20) are structurally and functionally the same.

A6. A PSE component (3) for a PoDL network or a PoDL network segment (1), in particular an SPE network and/or network segment, comprising
a microelectronic component (9) having a physical layer (PHY) (8), which can be connected to a powered device (2) (PD) by means of a line, in particular an SPE connection (TPE),
a safety circuit, which comprises and/or can be connected to a voltage source, wherein the safety circuit is connected upstream of the microelectronic component (9), characterized in that the safety circuit is configured as an interconnection element (5) according to one of the preceding clauses.

A7. A PSE component (3) according to clause A6, characterized in that the physical layer (PHY) (8) has two terminals (8.1, 8.2), wherein an interconnection of passive components, in particular of at least one resistor (16) and at least one capacitor (17), is connected immediately upstream of each of the terminals (8.1, 8.2).

A8. A method for monitoring and protecting a PoDL network and/or network segment, wherein at least one switching element (10, 20) is provided in each of two lines (31, 32) connected to a voltage source, and the voltage drop (source-drain voltage U_DS) over each switching element (10, 20) is measured, characterized in that the switching elements (10, 20) are actuated depending on the actual measured voltage values (controlled variable) by way of an actuation voltage (manipulated variable, gate voltage) that is proportional to the current flow (disturbance variable).

A9. A method according to clause A8, characterized in that the current flow in both lines (31, 32) is measured in a technically independent manner, and the measured values and/or data derived therefrom are evaluated together in a processor unit (6).

A10. A method according to clause A9, characterized in that the current flow in each switching element (10, 20) is calculated on the basis of the actuation voltages (manipulated variable/gate voltage) of the current flow (33) of the two switching elements (10, 20) and is compared for monitoring purposes.

A11. A method according to one of clauses A8 to A10, characterized in that the actual measured voltage value is recorded on the line portions of the lines (31, 32)
a) between the voltage source and the switching element (10, 20) and/or
b) downstream of the switching elements (10, 20) as viewed from the voltage source.

A12. A method according to one of clauses A8 to A11, characterized in that, after a disconnection due to a detection of an unequal amperage and/or an unequal current flow,
a user intervention occurs before any re-closing, in particular after a fault analysis and/or fault correction carried out by a user, or
b) the controller makes a specification by specifying an output limit or a power limit, such that re-closing and/or normal operation take(s) place on the basis of internal specifications of the controller.

A13. A method according to one of clauses A8 to A12, characterized in that a PSE component (3) according to one of clauses A6 or A7 is used and operated.

A14. A method according to one of clauses A8 to A13, characterized in that the method is used for a power supply and data network in which the data and the current are transmitted together over a two-wire cable, in particular an SPE (4) (Single Pair Ethernet) and/or a TPE (Twisted Pair Ethernet).

A15. A method according to one of clauses A8 to A14, characterized in that the limiting of the current involves disconnecting the current
to 0 A or
to a defined value>0, in particular to a value of up to 100 mA.

A16. A method according to one of clauses A8 to A15, characterized in that the amperage (33) of the two switching elements (10, 20) is calculated from the measured voltage values (manipulated variable U_GS) at said switching elements, and this amperage is compared with a target amperage specified in the processor unit (6) and additionally with an independently measured actual amperage in at least one of the two line paths (30, 31), in particular is compared in the processor unit (6), and wherein disconnection is carried out on the basis of this comparison.

LIST OF REFERENCE NUMERALS

1 PoDL network or network segment (1)
2 Powered device (PD)
3 PSE component
4 SPE
5 Interconnection element (5)

6 Microprocessor, processor unit
7 Component, passive (also 7.1, 7.2)
8 Physical layer (PHY)
8.1 Terminal, first
8.2 Terminal, second
9 Protective interconnection
10 Switching element
11 Line
12 Control line
13 Line
14 Ammeter (also 14.1, 14.2)
15 Control unit
16 Resistor
17 Capacitor
18 Voltmeter
19 Output voltage (U_IST)
20 Switching element
21 Line
22 Control line
23 Line
24 Control loop
27 Controlled system
28 Reference variable (U_Ref)
29 Feedback
30 Voltage terminal
31 Line, first
32 Line, second
33 Disturbance variable (I_S)
34 Controlled variable (U_DS)
35 Manipulated variable (U_GS)

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized.

Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

What is claimed is:

1. An electronic interconnection element, comprising:
   a voltage terminal comprising a first pole and a second pole;
   a first line for connecting the first pole to a first terminal of a physical layer of a microelectronic component;
   a second line for connecting the second pole to a second terminal of the physical layer;
   a switching element in each of the first line and second line, wherein the switching elements are connected to and controllable by a control unit, the control unit includes a microprocessor, and the control unit is configured to maintain the voltage drop across each switching element at a constant value by applying an actuation voltage to each switching element; and
   a voltage measurement unit configured to measure a voltage drop across each switching element and supply a value of the voltage drop to the microprocessor.

2. The electronic interconnection element of claim 1, wherein at least one of the switching elements is a field effect transistor (FET).

3. The electronic interconnection element of claim 2, wherein the at least one of the switching elements is a normally closed field-effect transistor.

4. The electronic interconnection element of claim 2, wherein at least one of the switching elements is a metal-oxide-semiconductor FET or an insulated gate bipolar transistor.

5. A power sourcing equipment component, comprising:
   a microelectronic component having a physical layer, wherein the physical layer is configured for connection to a powered device over an Ethernet link; and
   a safety circuit configured for connection between the microelectronic component and a voltage source, wherein
   the safety circuit includes a voltage source terminal having a first pole and a second pole;
   the safety circuit is configured to connect a first switching element between the first pole and a first terminal of the physical layer and a second switching element between the second pole and a second terminal of the physical layer; and
   the switching elements are connected to and controllable by a control unit configured to maintain the voltage drop across each switching element at a constant value by applying an actuation voltage to each switching element.

6. The power sourcing equipment component of claim 5, further comprising a passive circuit including at least one resistor and at least one capacitor connected to each of the first terminal and the second terminal.

7. The power sourcing equipment component of claim 5, wherein the safety circuit includes a voltage measurement unit configured to measure a voltage drop across each of the first switching element and the second switching element.

8. A method for monitoring and protecting a power over data line (PoDL) network or network segment, comprising:
measuring a first voltage drop across a first switching element connected between a first voltage source terminal and a first data terminal for connection to a PoDL link;
measuring a second voltage drop across a second switching element connected between a second voltage source terminal and a second data terminal for connection to the PoDL link;
maintaining a constant value of the first voltage drop by applying a first actuation voltage to the first switching element; and
maintaining a constant value of the second voltage drop by applying a second actuation voltage to the second switching element.

9. The method of claim 8, further comprising:
measuring a first line current in a first line connecting the first switching element between the first voltage source terminal and the first data terminal;
measuring a second line current in a second line connecting the second switching element between the second voltage source terminal and the second data terminal; and
evaluating the measured first current and measured second current using a microprocessor.

10. The method of claim 8, further comprising:
determining a first switching element current value from the first actuation voltage;
determining a second switching element current value from the second actuation voltage; and
comparing the first switching element current value and second switching element current value.

11. The method of claim 10, further comprising, if an inequality is detected between the first switching element current value and the second switching element current value, actuating the first switching element and second switching element to limit a first switching element current and a second switching element current.

12. The method of claim 11, further comprising, after actuating the first switching element and second switching element to limit the first and second switching element currents, receiving a user input or determining a specified output limit or power limit prior to actuating the first and second switching elements to restore the first switching element current and second switching element current.

13. The method of claim 11, wherein limiting the first switching element current and second switching element current comprises:
reducing the first and second switching element current values to 0 amperes; or
disconnecting the first and second voltage source terminals from the first and second data terminals.

14. The method of claim 11, wherein limiting the first switching element current and second switching element current comprises reducing the first and second switching element current values to at or below 100 milliamperes.

15. The method of claim 8, further comprising:
measuring a voltage between a first line connecting the first switching element between the first voltage source terminal and the first data terminal and a second line connecting the second switching element between the second voltage source terminal and the second data terminal, wherein
the measuring is between a first measurement point on the first line and a second measurement point on the second line, and
the first and second measurement points are either both located on a voltage source side of the respective first and second switching elements or both located on a data terminal side of the first and second switching elements.

16. The method of claim 8, further comprising:
determining a first switching element current value from the first actuation voltage;
determining a second switching element current value from the second actuation voltage;
comparing the first switching element current value or second switching element current value to a target current value; and
depending on a result of the comparing, actuating the first and second switching elements to disconnect the first and second data terminals from the first and second voltage source terminals.

17. The method of claim 16, further comprising:
measuring a line current value in at least one of a first line connecting the first switching element between the first voltage source terminal and the first data terminal and a second line connecting the second switching element between the second voltage source terminal and the second data terminal; and
comparing the line current value to at least one of the target current value, the first switching element current value and the second switching element current value, and wherein
the actuating the first and second switching elements is done depending on a result of comparing the line current value or comparing the first or second switching element current values.

18. The method of claim 8, wherein the PoDL link uses a two-wire cable.

19. The method of claim 18, wherein the PoDL link comprises a Single Pair Ethernet or Twisted Pair Ethernet link.

* * * * *